(12) United States Patent
Vodopyanov et al.

(10) Patent No.: US 12,199,397 B2
(45) Date of Patent: Jan. 14, 2025

(54) OPTICAL PARAMETRIC DEVICE BASED ON RANDOM PHASE MATCHING IN POLYCRYSTALLINE MEDIUM

(71) Applicants: UNIVERSITY OF CENTRAL FLORIDA RESEARCH FOUNDATION INC., Orlando, FL (US); IPG PHOTONICS CORPORATION, Oxford, MA (US)

(72) Inventors: Konstantin Vodopyanov, Orlando, FL (US); Sergey Vasilyev, Birmingham, AL (US); Mikhail Mirov, Birmingham, AL (US)

(73) Assignee: IPG PHOTONICS CORPORATION, Marlborough, MA (US)

( * ) Notice: Subject to any disclaimer, the term of this patent is extended or adjusted under 35 U.S.C. 154(b) by 68 days.

(21) Appl. No.: 16/605,917

(22) PCT Filed: Apr. 17, 2018

(86) PCT No.: PCT/US2018/028040
§ 371 (c)(1),
(2) Date: Oct. 17, 2019

(87) PCT Pub. No.: WO2018/195128
PCT Pub. Date: Oct. 25, 2018

(65) Prior Publication Data
US 2021/0124236 A1  Apr. 29, 2021

Related U.S. Application Data

(60) Provisional application No. 62/486,338, filed on Apr. 17, 2017.

(51) Int. Cl.
*H01S 3/10* (2006.01)
*G02F 1/35* (2006.01)
(Continued)

(52) U.S. Cl.
CPC .......... *H01S 3/1083* (2013.01); *G02F 1/3534* (2013.01); *G02F 1/3548* (2021.01);
(Continued)

(58) Field of Classification Search
CPC .... H01S 3/1083; H01S 3/10053; H01S 3/109; H01S 3/1623; H01S 3/1628; H01S 5/5054
See application file for complete search history.

(56) References Cited

U.S. PATENT DOCUMENTS 4,085,335 A * 4/1978 Guilino .................. G02F 1/39
359/330
2007/0236780 A1* 10/2007 Slater .................... H01S 3/083
359/330

(Continued)

*Primary Examiner* — Kinam Park
(74) *Attorney, Agent, or Firm* — Yuri B. Kateshov, Esq.

(57) ABSTRACT

An optical parametric device (OPD), which is selected from an optical parametric oscillator (OPO) or optical parametric generator (OPG), is configured with a nonlinear optical element (NOE) which converts an incoupled pump radiation at first frequency into output signal and idler radiations at one second frequency or different second frequencies, which is/are lower than the first frequency, by utilizing nonlinear interaction via a random quasi-phase matching process (RQPM-NOE). The NOE is made from a nonlinear optical material selected from optical ceramics, polycrystals, micro and nanocrystals, colloids of micro and nanocrystals, and composites of micro and nanocrystals in polymer or glassy matrices. The nonlinear optical material is prepared by modifying a microstructure of the initial sample of the NOE such that an average grain size is of the order of a coherence length of the three-wave interaction which enables the highest parametric gain achievable via the RQPM process.

14 Claims, 7 Drawing Sheets

(51) Int. Cl.
*G02F 1/355* (2006.01)
*G02F 1/39* (2006.01)
*H01S 3/108* (2006.01)
*H01S 3/109* (2006.01)
*H01S 3/16* (2006.01)
*H01S 5/50* (2006.01)

(52) U.S. Cl.
CPC .......... *G02F 1/3551* (2013.01); *G02F 1/3556* (2013.01); *G02F 1/39* (2013.01); *H01S 3/10053* (2013.01); *H01S 3/109* (2013.01); *H01S 3/1623* (2013.01); *H01S 3/1628* (2013.01); *H01S 5/5054* (2013.01)

(56) References Cited

U.S. PATENT DOCUMENTS

| | | | | |
|---|---|---|---|---|
| 2009/0040597 A1* | 2/2009 | Rae | ............................ | G02F 1/39 |
| | | | | 359/330 |
| 2011/0058248 A1* | 3/2011 | Vodopyanov | ............. | G02F 1/39 |
| | | | | 359/330 |
| 2012/0093179 A1* | 4/2012 | Dunn | ...................... | H01S 5/142 |
| | | | | 372/21 |

* cited by examiner

OPTICAL PARAMETRIC DEVICE BASED ON RANDOM PHASE MATCHING IN POLYCRYSTALLINE MEDIUM

BACKGROUND OF THE INVENTION

Field of the Disclosure

The disclosure relates to optical parametric devices (OPD). In particular, the disclosure presents an OPD based on random phase matching in polycrystalline medium material with quadratic nonlinearity. The disclosure further relates to the microstructure of the polycrystalline material and the methods of characterizing and optimizing the microstructure.

Prior Art

Nonlinear frequency conversion via three-wave mixing, including second harmonic generation (SHG), sum- and difference-frequency generation (SFG and DFG, respectively), optical parametric generation (OPG) and others, is one of the cornerstones of laser technology. The OPG, which is the subject matter of this disclosure, necessarily has a nonlinear optical (NOE) component which down-converts laser radiation (pump) into output radiations (signal and idler) at lower frequency. In particular, in the NOE crystals, the pump photon decays into less energetic signal and idler photons. Such a conversion thus may result in a range of different wavelengths in a desired portion of the spectrum, where direct laser radiation is not available.

Due to refractive index dispersion, the nonlinear conversion efficiency to new frequencies is generally low because of the destructive interference in the NOE. To overcome this limitation, the NOE should meet two conditions: (a) the sum of energies of signal and idler photons, which are resulted from the decay of the pump photon, is to be equal to that of the pump photon (FIG. 1), and (b) the sum of the signal and idler wavevectors (k-vectors) should be equal to that of the pump photon (FIG. 2). The latter is known as momentum conversion or phase matching (PM) condition.

In a birefringent crystal the perfect PM condition can be achieved by the crystal's proper orientation. However, the birefringent phase matching imposes certain limitations on the range of nonlinear materials, which are available for this method, and/or on nonlinear conversion efficiency. The limitations of birefringent phase-matching are well known to one of ordinary skill physicist.

Alternatively, the PM condition can be met in quasi-phase matching (QPM) crystals with periodically modulated nonlinearity. This technique helps overcome at least some of the known limitations of birefringent crystals. Not surprisingly then that most of the breakthroughs in this field in the last two decades were related to the development of QPM materials. The limitations on the use of the QPM process are mostly associated with challenges in the fabrication of NOEs. In particular, the known drawbacks may include complexity of the fabrication technology as the microstructure of the sample has to be precisely engineered in order to achieve the required QPM condition. As a consequence, very few QPM nonlinear materials are available and basically limited to PPLN, PPLT and their families, PPKTP (and their families), OP-GaAs, OP-GaP. The cost of QPM materials is very high by comparison with standard single-crystals and poly-crystals. The technological restrictions limit the size of QPM nonlinear materials. Also, the nonlinear frequency conversion in QPM materials requires precise orientation of the crystal sample with respect to the input beam and temperature control.

Still another alternative approach to phase matching, relies on random quasi-phase matching (RQPM) disordered $\chi^{(2)}$ crystalline materials where it can be described by the random walk or "drunken sailor walk" theory that also accounts for diffusion and heat transfer. The RQPM eliminates the need for orientation of the sample. Important feature of the RQPM process is broadband and flat response, which is highly desirable for a variety of applications, and stems from phase randomization due to arbitrary distribution of crystalline domains eliminating thus the destructive interference.

The price to pay however is that the output signal of RQPM process grows linearly with the sample length L, as opposed to quadratic dependence for perfect phase (or quasi-phase) matching with the efficiency reduction factor on the order of $L/L_{coh}$, where $L_{coh}$ is the 3-wave mixing coherence length. Still the robustness and compactness of nonlinear devices utilizing the RQPM process have a few unarguable advantages over other techniques. The number of disordered crystalline materials capable of achieving the RQPM is incomparably greater than that of the traditional nonlinear materials associated with the QPM process, The cost of the RQPM crystalline materials is substantially lower than that of the QPM crystals. For example, the price of the optical ceramics is a small fraction (0.1-1%) of that of the QPM material. Furthermore, the RQPM in the disordered crystalline materials would allow much larger spectral bandwidths as compared to traditional nonlinear crystals due to the random distribution of the microcrystalline domains.

A need therefore exists for an optical parametric device (OPD) configured to efficiently convert the pump radiation into an output signal and idler radiations while utilizing a three wave nonlinear interaction via RQPM process in a RQPM nonlinear optical element (RQPM-NOE).

Another need exists for a variety of nonlinear optical materials that can be effectively used in the OPD utilizing the three-wave nonlinear interaction via the RQPM process.

Still another need exists for a method of preparing the microstructure of the RQPM-NOE material used in the disclosed OPD.

A further need exists for a method of characterizing the RQPM-NOE material to be used in the disclosed RQPM OPD.

SUMMARY OF THE INVENTION

The present invention provides an OPD—an efficient ultra-broadband frequency converter, where substantial (tens of percents) down-conversion efficiency of pump radiation to signal and idler radiations can be reached,— based on the concept of the RQPM in a random polycrystalline material with $\chi^{(2)}$.nonlinearity. The key elements of this invention are: (i) the use of femtosecond (fs) pulses with high peak power that require correspondingly small length of the optical material to achieve a sufficient parametric gain, (ii) use of a disordered nonlinear optical material with an average grain size that is close to the coherence length of the parametric interaction. The present invention sets the stage for creating highly efficient OPOs and for producing ultra-broadband frequency combs (with more than two octaves-wide spectra) using nonlinear frequency conversion in the transparent optical ceramics via RQPM process.

In accordance with one aspect of the invention, an optical parametric device is configured with a NOE element made from random polycrystalline material with $\chi^{(2)}$.nonlinearity.

The NOE converts the received pump radiation into output signal and idler radiations via the RQPM-NOE process.

In accordance with another aspect of the invention, the OPD is made from a nonlinear optical material utilizing the nonlinear interaction via RQPM process and selected from the group consisting of optical ceramics, polycrystals, micro and nanocrystals, colloids of micro and nanocrystals, and composites of micro and nanocrystals in polymer and glassy matrices.

Still another aspect of the invention concerns nonlinear optical material used in the disclosed OPD which has a microstructure with the average grain size of the order of the coherence length of three-wave interaction enabling nonlinear interaction. The disclosed microstructure allows achieving a highest parametric gain via the RQPM-NOE process.

According to another aspect of the invention, the nonlinear material of the previous aspect can be optimized by implementing a method which includes measuring the local distribution of the efficiency of parametric interaction in RQPM-NOE, i.e., material mapping, using SHG, SFG, DGF non-threshold techniques.

The above aspects are obviously complementary to one another and can be used in any possible combination with one another. Moreover, each of the above aspects includes multiple features which are discussed in detail hereinbelow. All of the features of each aspect can be used with one another as long as the combination does not contradict the established laws of physics known to one of ordinary skill in the nonlinear optics. Furthermore, the features of different aspects also can be selectively used together in a variety of combinations without however compromising the established postulates of the nonlinear optics which concern frequency conversion processes.

BRIEF DESCRIPTION OF THE DRAWINGS

The above and other aspects and features of the invention are further discussed in detail and can be more apparent in light of the following drawings, in which.

SPECIFIC DESCRIPTION OF THE INVENTION

Figure 1:
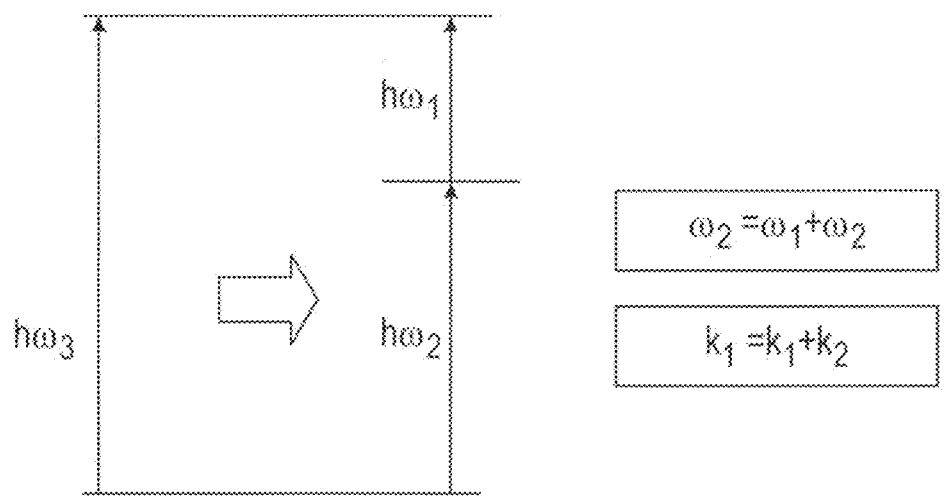
FIG. 1 is the illustration of the energy conservation condition for the parametric frequency conversion in the NOE crystals.
Figure 2:
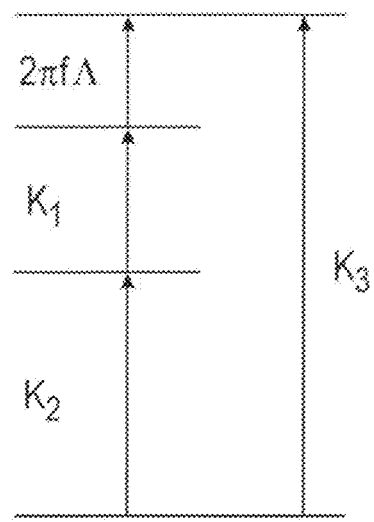
FIG. 2 is the illustration of the momentum conservation or phase matching condition for the efficient parametric frequency conversion in the NOE crystals.

Reference will now be made in detail to the disclosed system. Wherever possible, same or similar reference numerals are used in the drawings and the description to refer to the same or like parts or steps. The drawings are in simplified form and are far from precise scale.

Figure 3:
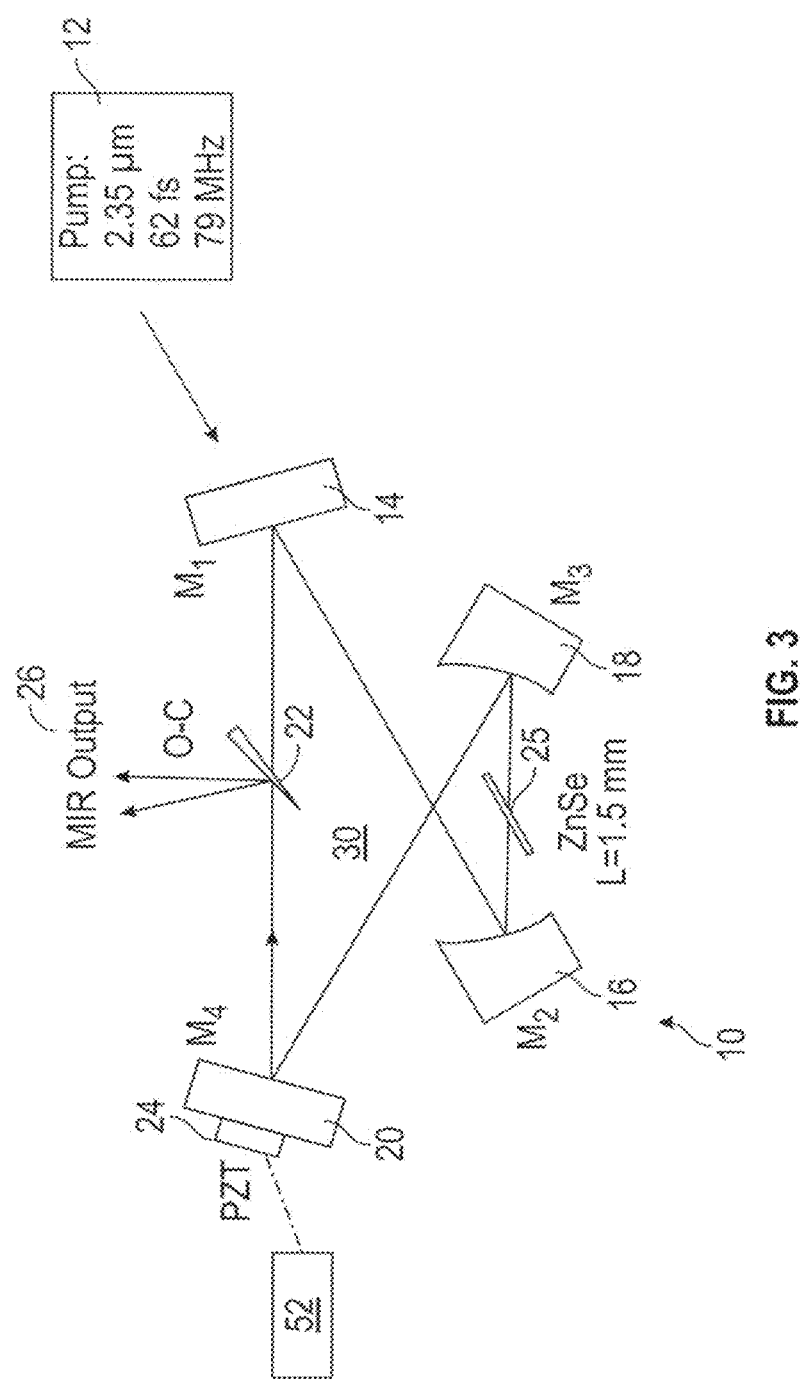
FIG. 3 is a general optical schematic of the inventive OPD.

Referring to FIG. 3, an exemplary schematic of the inventive optical parametric device (OPD) 10 is based on random phase matching (RQPM) in disordered $\chi^{(2)}$ polycrystalline materials such as ceramic-based nonlinear optical element NOE 25. The NOE 25 is configured to down-convert via RQPM process an incoupled pump radiation at first frequency $\omega_1$, which is generated by an optical pump 12, into output signal and idler radiations 26 at at least one lower second frequency $\omega_2$. The OPD 10 may be configured as an optical parametric generator (OPG) or optical parametric oscillator (OPO).

The configuration of OPD 10, as shown in FIG. 3, represents the OPO which necessarily includes a resonant cavity or resonator 30. As shown, a four mirror resonator includes optical components 14, 16, 18, and 24. The illustrated resonator is just one of multiple possible schemes of the resonator that can be used within the scope of the disclosure, as discussed below.

The OPO can be singly resonant when it is resonant at either the signal or the idler frequency. Alternatively, the OPO may be doubly resonant with both signal and idler radiations being simultaneously resonant. Still another possibility is a triply resonant OPO in which all three pump, signal and idler radiations are resonant at the same time.

The heart of OPD 10 is of course NOE 25. The material used for NOE 25 within the scope of this disclosure is selected from the group consisting of optical ceramics, polycrystals, micro and nanocrystals, colloids of micro and nanocrystals, and composites of micro and nanocrystals in polymer and glassy matrices. In particular the disordered $\chi^{(2)}$ crystalline material is selected from II-VI semiconductors including binary, ternary, or quaternary compounds, such as ZnSe, ZnS, ZnTe, ZnO, CdSe, ZnMgSe, CdMnTe, or CdZnTe. It is also possible to use the disordered material selected from groups III-VI. The group III may include GaAs, GaP, GaN), group IV may be represented by Si3N4, SiC), while Group VI is represented by, e.g., Ga2O3.

The NOE 25 may be also doped with ions of transition metals (TM) including $Cr^{2+}$, $Fe^{2+}$ or all suitable rare earth (RE) metals. The NOE 25 co-doped with ions of TM and RE is another salient feature of the disclosure allowing the nonlinear optical element to simultaneously provide luminescence, laser amplification and parametric amplification. Selecting the dopants to provide luminescence at the desired frequencies of respective signal and idler radiations provides a seed for either the signal or idler decreasing the OPO threshold.

The key to success in achieving the OPO or OPG action in the disclosed OPD is preparing the crystalline material of NOE 25 which has a microstructure with the desired grain size. It has been discovered that for enabling the highest parametric gain via RQPM process the average grain size should be of the order of a coherence length of the three-wave interaction.

The material used for experiments on inventive OPD 25 is ZnSe. It is a II-VI semiconductor with a bandgap of 2.7 eV and a perfect candidate for nonlinear optics applications because of its outstanding transparency (0.55 to 20 μm), relatively high 2-nd order nonlinearity (d14=20 pm/V), high optical damage threshold, and good mechanical properties. The QPM orientation-patterned ZnSe structures on patterned GaAs substrate are known to be used in SHG and DFG processes. But its use in other nonlinear frequency conversion processes, such as the parametric oscillation/generation, is not known to Applicants and can be explained, among others, by insufficient quality of the samples.

Figure 5:
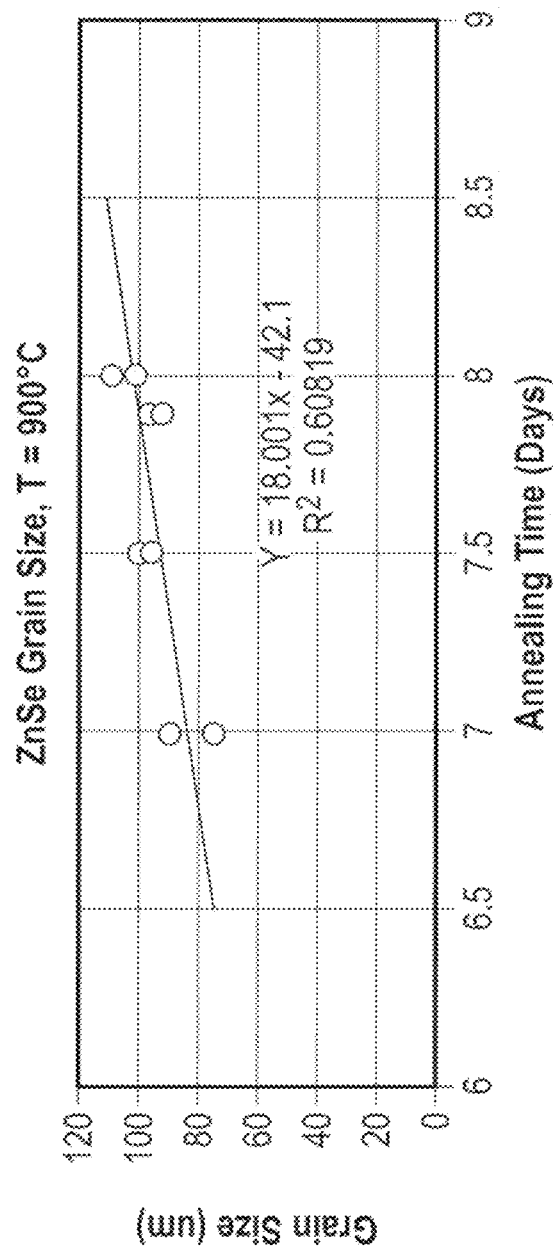
FIG. 5 illustrates a grain size/annealing time dependence.

The example of successfully prepared RQPM ZnSe ceramic samples includes the following method. Eighteen (18) samples of ZnSe CVD grown by II-VI Inc. with a size of 11×6×3 mm were individually sealed in quartz ampoules under $10^{-5}$ Torr vacuum and annealed, by a pair of samples at time, in an oven at fixed temperature 900 C. The annealing time varied from 6 to 10 days with a half a day interval. After annealing, the samples were removed from the ampoules and together with two untreated samples were chemically etched in hot 30% wt. NaOH solution at 94-96° C. for 30 min. The digital microscope images of the samples grain microstructure were analyzed in terms of the average grain size. It was revealed that the grain size of untreated samples was between 50 and 60 µm. The annealed samples have shown an apparent trend of grain size increase to 100 µm after 8 days of annealing, as shown in FIG. 5. The average grain size of the tested samples chosen for OPO experiments was close to the optimal of $\approx L_{coh} \approx 100$ µm.

Alternatively, instead of annealing, a hot pressing step of the initial sample may be utilized by controlling an environmental characteristic selected from the group consisting of pressure in addition to gas atmosphere, temperature, time, dopants, and dopant concentration and a combination of these environmental characteristics which are also applicable to the annealing method.

Still another alternative method includes hot isotactic pressing step of the initial sample while controlling an environmental characteristic selected from the group consisting of pressure, temperature, time, dopants and dopant concentration and a combination of these environmental characteristics. Also important for all of the above disclosed methods is to pay particular attention to whether any given process is implemented in the presence of air, in vacuum, or gaseous medium such as, e.g., H2 or Ar. The temperature range is defined between room and melting temperatures.

Figure 4A:
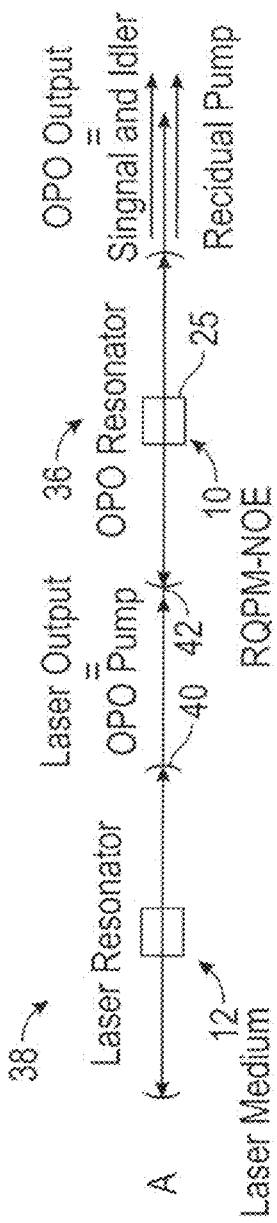
FIGS. 4A-4C schematically illustrate various configurations of the inventive OPD.
Figure 4B:
Figure 4C:
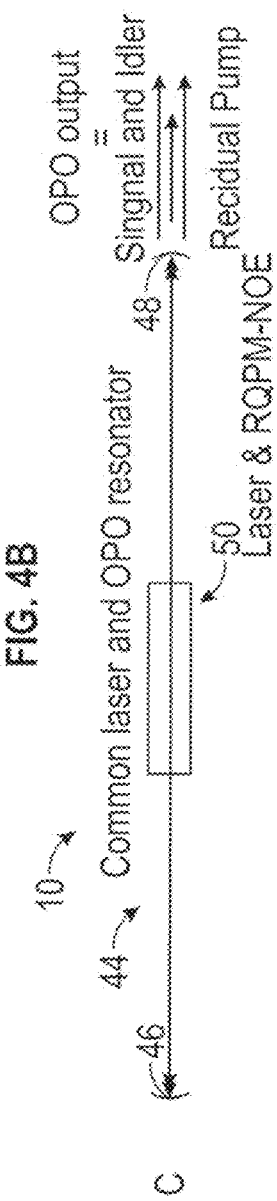

FIGS. 4A-4C illustrate possible configurations of the inventive OPD. Specifically, OPD 10 of FIG. 4A, which is conceptually similar to that of FIG. 3, is configured with two separate resonators 38 and 36 of respective pump laser 12 and an OPO based on NOE 25, which in turn may be doped with light emitting ions. The resonators 38 and 36 each are defined between respective frequency discriminators with an output coupler 40 of pump resonator 38 being spaced apart from input coupler 42 of OPO resonator 36.

The OPD 10 of FIG. 4B features an alternative configuration of pump laser and OPO resonators. As shown, the laser medium of pump laser 12 and NOE 25 of the OPO are placed inside a resonant cavity 44 common to both mediums. The cavity is defined between high reflection frequency discriminator 46 and low reflectivity frequency discriminator 48 configured to provide circulation of pump, signal and idler radiations in the common resonant cavity.

FIG. 4C shows the inventive OPD which, like the scheme of FIG. 4B, has common cavity 44 for laser and OPO gain elements with frequency discriminators 46 and 48 defining the cavity therebetween. In contrast to FIG. 4B, a monolithic medium 50 is configured such that it simultaneously functions as a laser medium and nonlinear medium upon being doped with laser active optical centers.

Figure 6A:
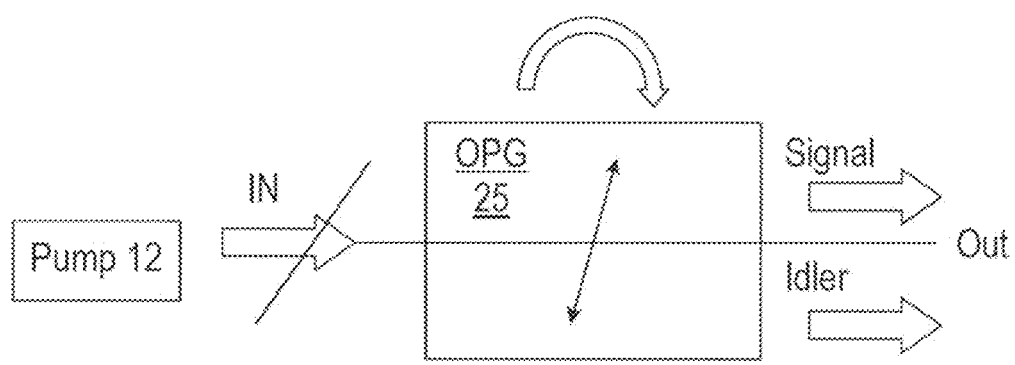
FIGS. 6A-6C illustrate different OPO/OPG schemes known to one of ordinary skill in the nonlinear optics.
Figure 6B:
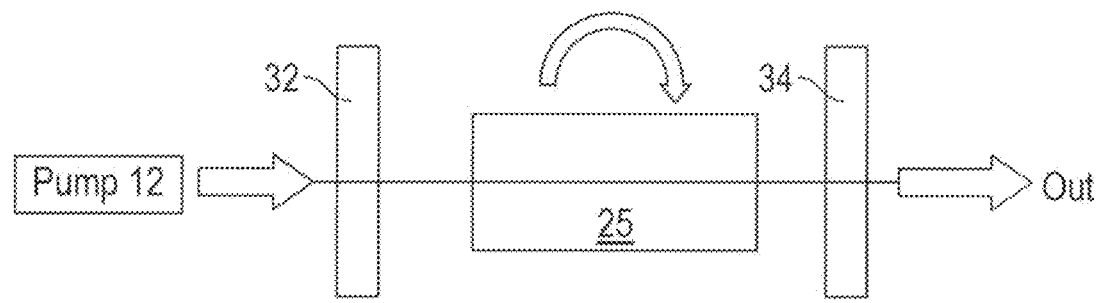
Figure 6C:
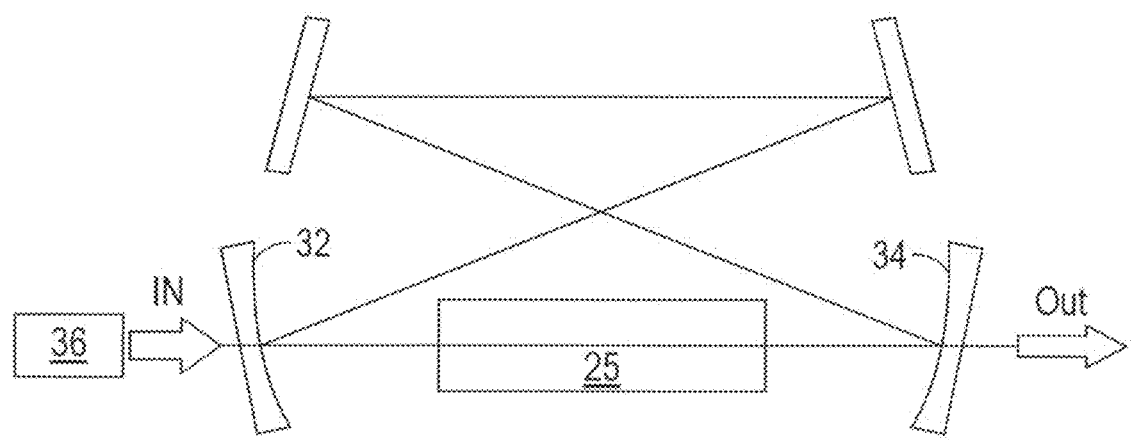

FIGS. 6A-6C illustrate respective alternative configurations of the resonator provided with the inventive NOE 25. Referring specifically to FIG. 6A, assuming that short intense pump pulses, such as femtosecond (fs) pulses, are used, a single pass through NOE crystal 25 may be sufficient to convert the pump radiation into the signal and idler radiations. As well understood by one of ordinary skill worker in the nonlinear optics art, the illustrated scheme relates to an optical parametric generator (OPG). For pulses with smaller intensity, parametric frequency conversion is weaker which necessitates a resonator which in combination with NOE crystal 25 defines the OPO as shown in FIG. 6B.

However, as opposed to the 4-mirror ring configuration of FIG. 3, the resonator of FIG. 6B includes only two mirrors: input coupler 32 and output coupler 34. The configuration of FIGS. 6A-6B have been disclosed in combination with pulsed optical pump 12. Alternatively, the pump may operate in a continuous wave (CW) regime. FIG. 6C illustrates CW pump 36 used in conjunction with a bowtie or ring resonator which has a four mirror OPO cavity with two flat and two concave mirrors.

The scope of the disclosure is not limited to the above disclosed resonator configurations. For example, various types of the micro-resonator, i.e., resonators fully integrated within NOE 25, are well known to one of ordinary skill in the nonlinear optics are part of the disclosure.

Common to all of the above-disclosed configurations of the resonator, some of input or output or both input and output mirrors can be dichroic. The optical elements providing input of pump radiation into the cavity of the OPO or directly into the OPG as well as optical couplers operative to remove signal and idler (and remaining pump) radiation from the resonator/OPG do not have to necessarily be mirrors. As shown in FIG. 3, a wedge 22 located within the resonator may function as a coupler (not shown) or decoupler that may or may not be configured with AR coatings or mirror coatings.

Returning to FIG. 3, pump 12 is another salient feature of the disclosure. As mentioned above, it may operate in both CW and ns and sub-ns pulsed regimes. It has been discovered that for short (sub-100-fs) pump pulses with high peak power the optimal length of the crystal is typically small (sub-mm), while the coherence length of three-wave mixing can be relatively large (~100 µm in the mid-IR spectral range) Hence, a reduction factor of WPM process, $L/L_{coh}$, is not that large, In light of this discovery, the last decade saw a rapid development of ultrafast lasers based on TM-doped II-VI semiconductors. Among these fs and ps lasers, based on ZnS and ZnSe doped with $Cr^{2+}$ ions (wavelength range 2-3 µm) are most frequently used. The advantages of Cr:ZnS/ZnSe materials include a very broad gain bandwidth that allows producing short (down to few optical cycles) pulses, the absence of excited state absorption, close to 100% quantum efficiency of fluorescence at room temperature, and convenient pumping by erbium and thulium doped fiber lasers with a conversion efficiency in excess of 60%. Currently Cr:ZnS/ZnSe lasers can produce more than 7 W of the average power in the mode-locked regime, and more than 1 GW of peak power in the regime of chirped-pulse amplification. These lasers are also found to be very suitable for pumping of mid-IR OPOs based on GaAs. Using this type of lasers within the scope of the disclosure allows the use of the same materials for NOE 25 of OPD 10 and pump laser 12. Accordingly all of the above disclosed materials used for NOE 25 are suitable for the pump laser.

An ultrafast laser can be used to generate an optical frequency comb. As known, the shorter the laser pulses, the broader the range of frequencies in the comb. The mode-locked lasers can be configured to emit femtosecond pulses lasting quadrillionths of a second, or millionths of a billionth of a second. The resulting comb may span several hundred thousand uniformly spaced apart frequencies, or teeth, enabling flexible and accurate measurements of wide-ranging or widely varied phenomena The OPD 10 is synchronously pumped, i.e., pumping of OPD 10 with pulses is in synchronism with the pump-emitted pulses. Synchronization requires matching the pump pulse repetition rate and the round-trip frequency of the OPO. The match may be monitored and controlled by a variety of means including, for instance, a mechanical control mechanism, advantageously the latter includes a servo system. The latter, in case of measure mismatch, sends a control signal to an actuator operative to affect one of optical components of the resonator and thus adjust the round trip time. FIG. 3 illustrates a piezo element 24 operatively coupled to a servo system 52 and mounted on HR mirror 20 which, for example, is gold coated.

Figure 7:
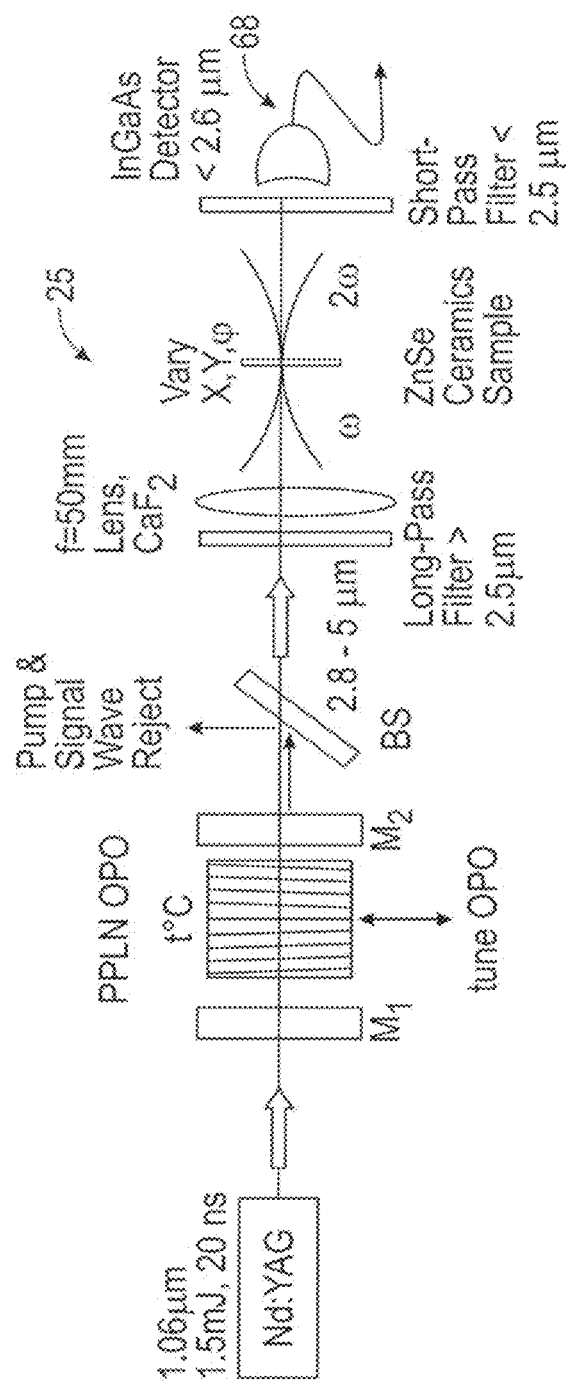
FIG. 7 is a setup for the prepared NOE characterization via SHG.

FIG. 7 illustrates a setup 55 implementing a method of characterization of the microstructure of prepared sample 25 characterized from the viewpoint of SHG (4.7->2.35 μm) conversion efficiency using a nanosecond 4.7-μm laser source. The rationale behind the use of SHG for evaluating purposes is that it is an inverse process with respect to OPO and hence SHG efficiency is a direct indicator of the OPO gain that can be achieved. Another advantage of the use of an inverse SHG process is an absence of a threshold for the nonlinear frequency conversion. This threshold-less process greatly simplifiers the characterization of the microstructure. Alternatively, instead of the SHG, SFG or DFG process may be implemented for the same purposes.

Figure 8:
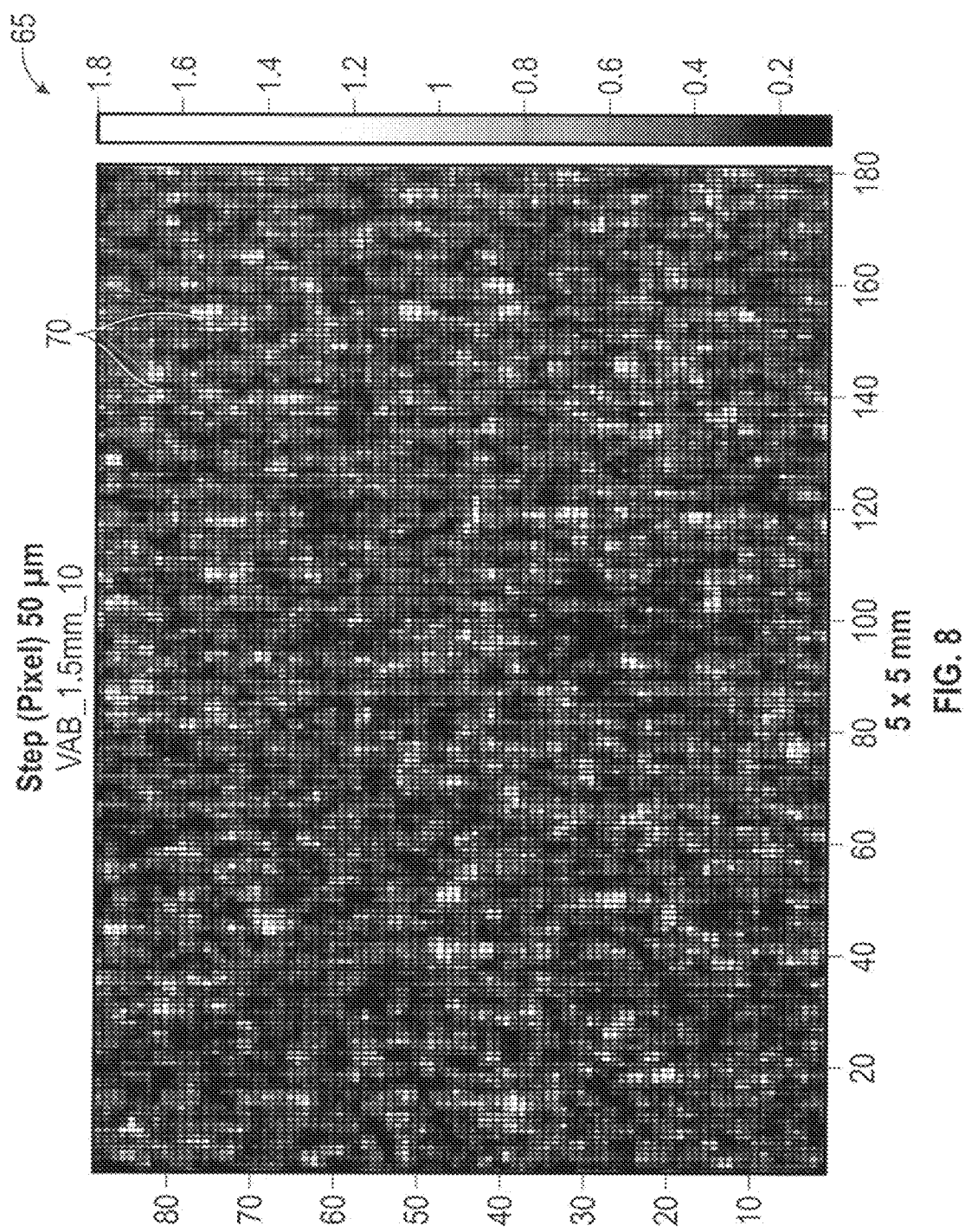
FIG. 8 is a false-color map of SHG efficiency distribution in the sample characterized in the setup of FIG. 7.

A typical result of SHG mapping is shown on a resulting false-color map of SHG efficiency distribution—histogram 65 shown in FIG. 8. The histogram 65 reveals a broad distribution related to random variation of the alignment and size of crystalline domains. As can be seen there are "hot" spots 70 which are lighter that are used for OPO amplification that surrounding spots. These hot spots 70 are further used to achieve the OPO oscillation when the characterized sample is placed in POD 10 of FIG. 3 and the coordinates of the desired locations are sent to a means operative to displace NOE 25 in multiple desired positions. Each of the positions corresponds to the one of the location identified as "promising" and characterized by this location located in the waist of the pump radiation. This process is automated and requires a computer with executable software. Once characterized and optimized, the NOE is ready to be incorporated in the inventive OPD.

A series of experiments was conducted using the setup of FIG. 3. The OPO was synchronously pumped by a Kerr-lens mode-locked 2.35-μm $Cr^{2+}$:ZnS laser 12, with 62-fs pulse duration, 650-mW average power, and 79-MHz repetition rate. The bow-tie ring OPO cavity was composed of an in-coupling dielectric mirror M1 14 with high transmission (>85%) for the 2,35-μm pump and high reflection(>95%) for 3-8 μm, two gold-coated parabolic mirrors M2 16 and M3 18 with 30° off axis angle and 30 mm apex radius, five gold-coated flat mirrors (for simplicity only M4 24 was shown in the setup figure, the other four gold mirrors were used for folding the cavity. An uncoated plane-parallel polished 1.5-mm-thick ZnSe ceramic sample 25 was placed between the two parabolic mirrors 16 and 24 at Brewster's angle. A 0.3-mm-thick ZnSe wedge was used inside the cavity for variable outcoupling the OPO signal/idler waves.

The device was operating in a doubly-resonant frequency-divide-by-2 mode near degeneracy. In addition to lowering the pump threshold, this arrangement provides other advantages: (i) phase- and frequency-locking of the OPO output to the pulse train from the pump laser—a prerequisite for creating precision mid-IR frequency combs, and (ii) the possibility of achieving extremely broadband spectrum due to negligible group velocity dispersion of ZnSe in the vicinity of 4.7-μm subharmonic of the pump. The OPO action was achieved at 90 mW of average 2.35-μm pump power. The output spectrum, measured with a monochromator and an MCT detector, spans 3-7.5 μm (1330-3330 cm-1) at −40 dB level, and is centered at 4.7-μm degeneracy (FIG. 4). At the maximum pump, the OPO average power was 30 mW and the pump depletion was as high as 79%, which indicates that one can obtain considerable, approaching 100%, photon conversion efficiency.

Thus the disclosed device provides optical parametric oscillation that is based on random phase matching in a disordered $\chi^{(2)}$ polycrystal, ZnSe ceramic. To the best of Applicants' knowledge this is (i) the first $\chi^{(2)}$ OPO that utilizes ceramic material and (ii) the first OPO based on ZnSe. With ZnSe ceramic being an inexpensive alternative to QPM solutions based on orientation patterning, this device can be used as a prototype for broadly-tunable OPOs, as well as for generating multi-octave frequency combs.

Those skilled in the art will recognize or be able to ascertain using no more than routine experimentation many equivalents to the specific embodiments of the invention described herein. The disclosed schematics are representative of an OPO and the impetus for the presently disclosed structure lies in the use of the polycrystalline materials available to the inventors. It is therefore to be understood that the foregoing embodiments are presented by way of example only and that within the scope of the appended claims and equivalents thereto, the invention may be practiced otherwise than as specifically described. The present disclosure is directed to each individual feature, system, material and/or method described herein. In addition, any combination of two or more such features, systems, materials and/or methods, if such features, systems, materials and/or methods are not mutually inconsistent, is included within the scope of the present invention.

The invention claimed is:

1. An optical parametric device (OPD) selected from an optical parametric oscillator (OPO) or optical parametric generator (OPG) and comprising a random polycrystalline nonlinear optical element (NOE) configured to convert an incoupled pump radiation at first frequency into output signal and idler radiations at at least one second frequency, which is lower than the first frequency, by utilizing nonlinear interaction via a random quasi-phase matching process (RQPM-NOE).

2. The OPD of claim 1 further comprising a laser pump outputting the pump radiation at the first frequency and operating in a continuos wave (CW) regime or pulsed regime with a nanosecond, (ns) picosecond (ps) or femtosecond (fs) pulse duration.

3. The OPD of claim 2, wherein the pump laser is a mode-locked laser outputting fs and ps pulses.

4. The OPD of claim 2 or 3, wherein the pump laser is configured to generate an optical frequency comb.

5. The OPD of the above claims, wherein the NOE is synchronously pumped.

6. The OPD of claim 5 further comprising a servo control system operative to maintain the synchronous pumping.

7. The OPD of one of the above claims, wherein the pump laser is based on a gain element made from a TM: II-VI materials which are selected from the group consisting of $Cr^{2+}$ and $Fe^{2+}$ doped binary compounds in single-crystal or polycrystalline form (e.g. ZnSe, ZnS, CdSe), or ternary or quaternary compounds in single-crystal or polycrystalline form including ZnMgSe, or CdMnTe.

8. The OPD of one of the above claims, wherein the pump laser is configured with a resonant cavity receiving the gain element, the NOE being located;

outside the resonant cavity of the pump laser, inside the resonant cavity of the pump laser but spaced therefrom, or inside the resonant cavity of the pump laser, wherein the gain element f the pump laser and NOB are combined together in a monolithic piece which provides parametric amplification and laser emission.

9. The OPD of claim 1, wherein the OPO is configured with a plurality of optical components surrounding the NOE and defining an optical resonator of the OPO.

10. The OPD of claim 1, wherein the OPO or OPG is configured to operate near degeneracy with the signal and idler radiations at the second frequency being substantially equal.

11. The OPD of claim 1, wherein the OPO is configured a a sir gle,, double, or triple resonant OPO.

12. The OPD of claim 1, wherein the OPO is configured with a micro-resonator fully integrated in the NOE.

13. The OPD of claim 1, wherein the OPG includes at least one input coupler operative to couple the pump radiation into the NOE and at least one output coupler operative to decouple the signal and idle radiations from the NOE, at least one of the input and output couplers being a dichroic mirror or wedge or plate and being optionally provided with a AR or mirror coating.

14. The OPD of claim 1, wherein at least one of the optical components of the OPO is an input coupler operative to incouple the pump radiation into the optical resonator, and at least one another optical components is an output coupler operative to decouple the signal and idler radiations from the optical resonator, at least one of or both the input and output couplers being a dichroic mirror or plate or wedge and being provided with or without an AR or mirror coating.

* * * * *